United States Patent [19]

Ganesan et al.

[11] Patent Number: 5,331,221
[45] Date of Patent: Jul. 19, 1994

[54] GAIN LINEARITY CORRECTION FOR MOS CIRCUITS

[75] Inventors: Apparajan Ganesan, Salem, N.H.; Paul F. Ferguson, Jr., Tewksbury; David H. Robertson, Somerville, both of Mass.

[73] Assignee: Analog Devices, Inc., Norwood, Mass.

[21] Appl. No.: 110,327

[22] Filed: Aug. 23, 1993

Related U.S. Application Data

[63] Continuation of Ser. No. 654,341, Feb. 12, 1991, abandoned.

[51] Int. Cl.$^5$ .................. H03K 17/14; H03K 3/013; H03F 1/30
[52] U.S. Cl. .................. 307/491; 307/296.8; 307/304; 307/307; 307/568
[58] Field of Search .............. 307/308, 304, 491, 493, 307/494, 568, 296.1, 296.4, 296.5, 296.8, 443, 307

[56] References Cited

U.S. PATENT DOCUMENTS

| | | | |
|---|---|---|---|
| 4,717,846 | 1/1988 | Ando | 307/443 |
| 4,740,713 | 4/1988 | Sakurai et al. | 307/443 |
| 4,920,287 | 4/1990 | Hartgring et el. | 307/443 |
| 4,996,446 | 2/1991 | Nakada | 307/443 |

FOREIGN PATENT DOCUMENTS 0210155  1/1987  European Pat. Off. .

OTHER PUBLICATIONS

Design Considerations for a High-Performance Three Micrometer CMOS Analog Standard-Cell Library, C. A. Laber et al.
U. Gatti et al.: "A Novel CMOS Linear Transconductance Cell for Continuous-Time Filters".

*Primary Examiner*—John Zazworsky
*Attorney, Agent, or Firm*—Wolf, Greenfield & Sacks

[57] ABSTRACT

Gain linearity problems caused by impact ionization in a active MOS device are avoided by connecting an MOS shield device in series with the active MOS device so that the overall supply voltage is split across two devices, keeping both devices in a region of operation well below where impact ionization becomes a significant problem. The gate of the MOS shield device is maintained at a voltage proportional to its drain voltage, thereby keeping the device in the saturation mode and avoiding an abrupt mode change associated with prior art shield circuits.

6 Claims, 3 Drawing Sheets

GAIN LINEARITY CORRECTION FOR MOS CIRCUITS

This application is a continuation of application Ser. No. 07/654,341, filed Feb. 12, 1991, now abandoned.

FIELD OF THE INVENTION

This invention relates to gain correction circuitry for MOS analog circuits and, in particular, to circuits for correcting gain non-linearities caused by impact ionization.

BACKGROUND OF THE INVENTION

A problem known as impact ionization occurs in MOS semiconductor devices which problem produces a non-linearity when the devices are used as gain stages. The problem occurs when electric fields in the devices become so large that free electrons traveling through the devices gain enough energy in the field to strip additional electrons from the molecular lattice. Consequently, the problem has become more severe as device sizes have been reduced and/or supply voltages increased.

For example, in a conventional n-channel MOS transistor in a 3 micron, 10 volt, CMOS process, the electric field strength at the drain end of the channel becomes high enough to cause impact ionization when the drain-source voltage increases above approximately five volts. The magnitude of the peak field strength is a function of a number of variables and cannot easily be controlled to reduce the effect of impact ionization. The effect is also present in p-channel devices, although it occurs at higher supply voltages.

Free electrons which are stripped from the lattice eventually migrate to either the source electrode or the substrate (backgate electrode), thereby creating an undesirable current. This current affects the electrical characteristics of the device. More particularly, in a typical MOS device, as the drain-source voltage increases from zero volts, the device enters a linear region in which the drain current increases approximately proportional to the drain-source voltage. As the drain-source voltage is increased further, the device enters a saturation region in which the drain current remains relatively constant as the drain-source voltage increases. However, as the drain-source voltage increases still further, impact ionization begins and the drain-to-backgate current begins to increase exponentially. The drain-to-backgate current approximately obeys the equation:

$$I_{dbg} \approx k \cdot 10^{V_{DS}}$$

Obviously, above a certain drain-source voltage the drain-to-backgate current becomes substantial. Since the drain-to-backgate current varies with the drain-source voltage in a non-linear manner, it appears as a non-linear leakage current to the backgate electrode from the drain of the device. If the device is used as a "gm" gain stage, this leakage current appears as a resistive load on the output which, in turn, produces a non-linear gain.

In order to overcome this problem, prior art circuitry has used shield transistors to reduce the drain-source voltage across an MOS device thereby keeping the drain-source voltage below the level at which impact ionization becomes a significant problem. In particular, it is known to place a common-gate NMOS cascode device in series with an n-channel active device so that the total drain-source voltage is split across the two devices and neither device has a sufficient drain-source voltage across it to cause an impact ionization problem. This prior art approach is discussed in detail in an article entitled "Design Considerations for a High-Performance 3-um CMOS Analog Standard-Cell Library", C. A. Laber, C. F. Rahim, S. F. Dreyer, G. T. Uehara, P. T. Kwok and P. R. Gray, *IEEE Journal of Solid-State Circuits*, v. SC-22, n. 2, pp 181–189 (April 1987).

Although this prior art approach generally solves the problem of impact ionization, it introduces an additional problem. More particularly, in present prior art shield circuits, the gate voltage of the NMOS shield transistor is fixed, generally at a voltage approximately mid-way between the supply voltages. Consequently, for positive voltage swings of the active device, the shield device goes into saturation, while for negative voltage swings, the shield device enters the deep triode, or linear, region. The abrupt transition between the saturation mode and the linear mode causes the impedance looking into the shield device to go through a step. This transition occurs in all circuits using the prior art circuit and results in an abrupt gain change in the circuit.

Accordingly, it is an object of the present invention to provide a gain correction circuit for an MOS device in which the effects of impact ionization are reduced.

It is another object of the present invention to provide a gain correction circuit for MOS devices in which the effects of impact ionization are reduced while maintaining linear gain in the MOS device.

It is another object of the present invention to provide a gain correction circuit for MOS devices which can be easily integrated into existing device designs.

SUMMARY OF THE INVENTION

The foregoing problems are solved and the foregoing objects are achieved in one illustrative embodiment of the invention in which an MOS shield device is connected in series with an active MOS device so that the overall supply voltage is split across two devices, keeping both devices in a region of operation well below where impact ionization becomes a significant problem. The gate of the MOS shield device is maintained at a voltage proportional to its drain voltage, thereby keeping the device in the saturation mode and avoiding the abrupt mode change associated with the prior art shield circuits.

DETAILED DESCRIPTION OF THE PREFERRED EMBODIMENT

Figure 1:
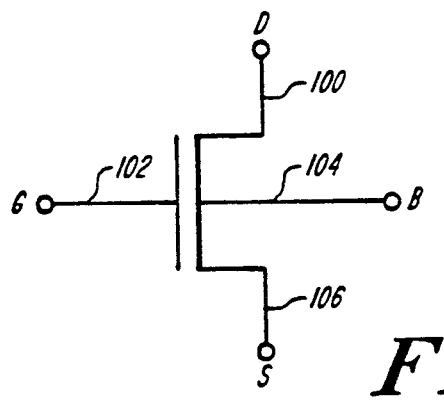
FIG. 1 is a schematic drawing of an n-channel MOS device.

FIG. 1 shows a schematic diagram of an n-channel MOS transistor which can be protected by the present invention. This well-known type of device has a drain electrode 100, a gate electrode 102, a backgate electrode 104, and a source electrode 106. During device operation, current passes from the drain 100 to the source 106 under control of a voltage supplied to the gate electrode 102. Since the operation of such devices is very well known it will not be discussed further herein.

Figure 2:
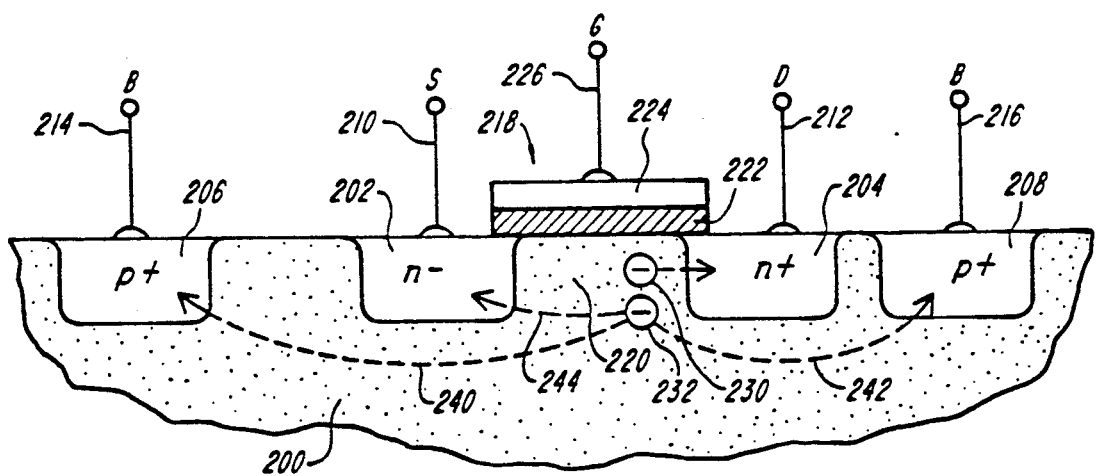
FIG. 2 is a cross-sectional diagram of the device shown schematically in FIG. 1.

FIG. 2 is a cross-sectional view of a typical MOS device corresponding to the FIG. 1 schematic diagram, showing the different regions which form the transistor source, drain, gate and backgate areas. In particular, the MOS device shown in FIG. 2 is constructed in a substrate 200 which has been doped during fabrication to have p- characteristics. Three regions are diffused into substrate 200 to define a source region 202 and a drain region 204, and regions 206 and 208 to provide for connections of the backgate electrodes. More particularly, an n-region 202 is created which functions as the device source. An electrode 210 is connected to this diffused area by means of well-known bonding techniques.

In a similar manner, n+ region 204 is diffused into substrate 200 to provide for the drain region. An electrode 212 is connected to this region.

P+ regions 206 and 208 are defused into the substrate 200 to provide a low-valued ohmic connection between substrate 200 and the backgate electrodes, 214 and 216. Typically, the entire structure may be annular or the source, drain and backgate regions may have other shapes in accordance with well-known fabrication techniques.

A gate structure, 218, is also formed over the "channel" 220 formed between the source area 202 and the drain area 204. The gate structure consists on an insulating layer 222 formed on the surface of the substrate 200 and a polysilicon layer 224 which overlays the insulating layer and forms the device "gate" Polysilicon layer 224 is, in turn, bonded to an electrode 226 to form the gate electrode of the device.

During normal operation of the unit as shown, electrons (schematically illustrated by the circle 230) travel from source region 202 to the drain region 204 under influence of an electric field created by a drain-source voltage placed across electrodes 210 and 212. As previously mentioned, as this drain-source voltage increases due to increased supply voltages or to reduced device sizes, the field strength near the drain region 204 can become sufficiently large that electrons 230 receive enough energy from the field to strip additional electrons (illustrated as circle 232) free from the molecular lattice. These electrons migrate either to the backgate regions 206 and 208 (this migration is shown schematically by arrows 240 and 242) or to the source region (as shown schematically by arrow 244) resulting in the undesirable leakage current previously discussed in the background of the invention.

Figure 3:
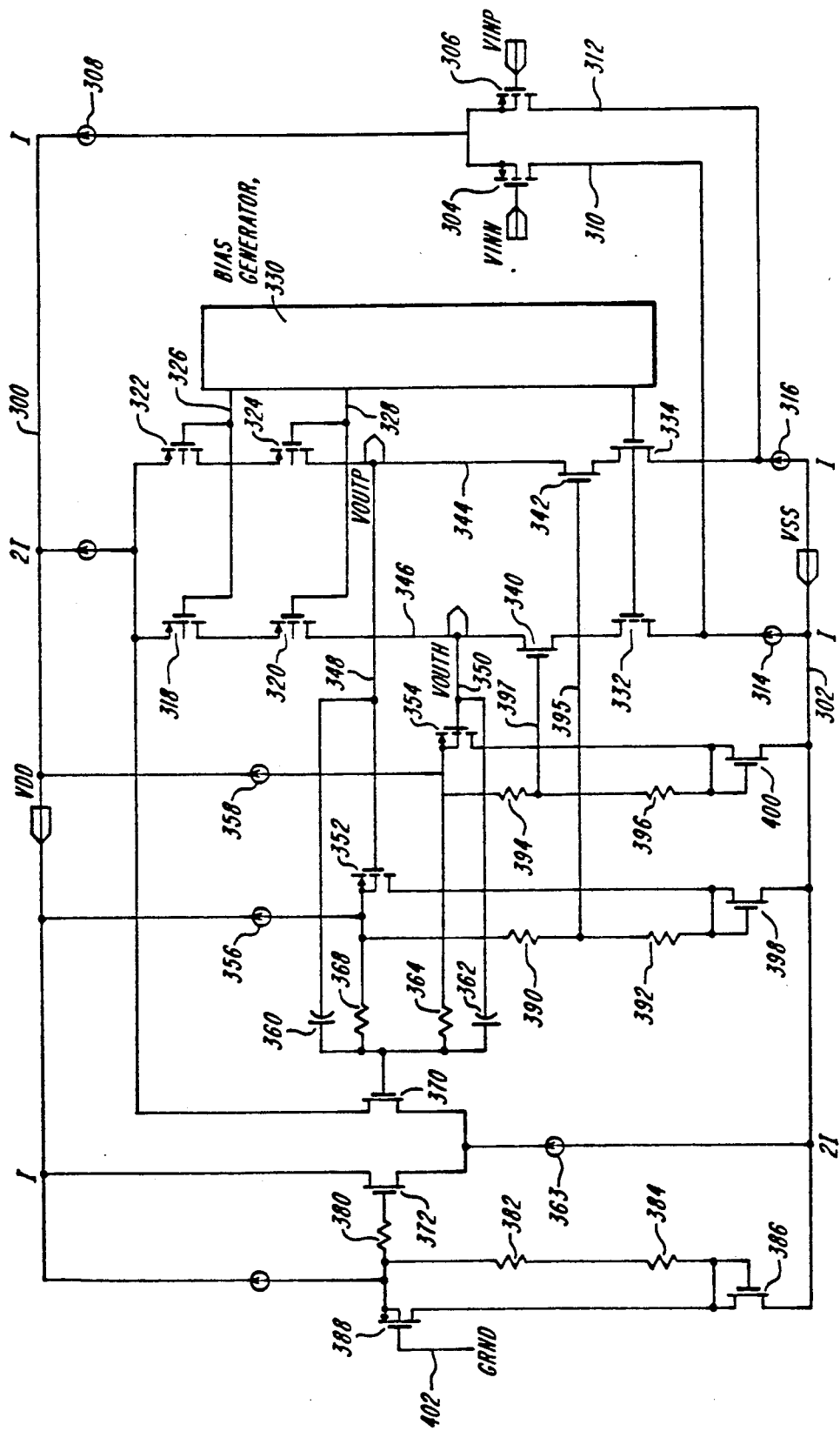
FIG. 3 is an electrical schematic diagram of an illustrative operational amplifier circuit incorporating the inventive gain correction circuitry.

FIG. 3 is a partial schematic diagram of an illustrative MOS operational amplifier circuit which incorporates the inventive gain correction circuitry. In particular, in a conventional manner, the illustrated circuitry operates with split voltage supplies consisting of a drain voltage $V_{DD}$ (with respect to circuit ground) applied to rail 300, and a source voltage $V_{SS}$ (with respect to circuit ground) applied to rail 302. Generally, the $V_{DD}$ and $V_{SS}$ voltages are symmetrical with respect to circuit ground. The particular circuit illustrated is constructed with complementary construction in that it has both a positive and a negative input.

The input circuitry consists of input differential pair PMOS transistors 304 and 306, connected in series with current source 308 (represented by an arrow within a circle). The construction and operation of current source 308 are well-known to those skilled in the art, and, accordingly, for clarity, current sources which are not critical to the operation of the inventive circuitry have been schematically illustrated as arrow within a circle.

Input transistors 304 and 306 comprise a differential transistor pair in which a negative voltage signal on terminal $V_{INN}$ is applied to the gate electrode of transistor 304, and a positive voltage signal on terminal $V_{INP}$ is applied to the gate electrode of transistor 306. The differential transistor pair functions to convert the input voltage signals to current signals by steering the current flowing through source 308 (to the drain rail 300) through the leads 310 and 312 and regulating the percentage of current in each of the leads. The current signals developed by transistors 304 and 306 are applied, via leads 310 and 312, to the gain portion of the amplifier.

The gain or active portion consists of current source transistors 318, 320, 322 and 324, which are also arranged in a complementary construction. Transistors 318 and 320 are connected in series to increase the output impedance of the amplifier. Transistors 322 and 324 are connected in series for the same reason. Transistors 318 and 320 are also connected in series with current source transistor 332 and current source 314. In a similar manner, transistors 322 and 324 are connected in a series configuration with current source transistor 334 and current source 316 MOS transistors 318-324 constitute the active or driver transistors in the driver section of the amplifier.

Since current sources 314 and 316 draw a relatively constant current, the current flowing in from leads 310 and 312 effectively controls the current flowing through gain transistors 318-324. The gate leads of transistors 318-324, 332 and 334 are connected to a bias generator circuit 330, which maintains voltages on the gate leads to keep the transistors operating at the proper voltages. The operation and construction of the bias generator circuitry 330 is well-known to those skilled in the art and is not important for an understanding of the present invention. Accordingly, it will not be discussed further in detail hereinafter.

It should be noted that the aforementioned impact ionization problem does not occur in current source transistors 318-324 because such transistors are PMOS devices and, as previously mentioned, the impact ionization effect occurs in PMOS devices at significantly higher drain source voltages than NMOS devices. The illustrative amplifier has been designed to operate with supply voltages which are below the voltage threshold where impact ionization becomes a problem for PMOS devices. However, in the absence of any correction circuitry, impact ionization would pose a severe problem with current source transistors 332 and 334. As will be hereinafter described, these latter transistors are protected by means of the inventive gain correction circuitry.

More particularly, the inventive circuitry operates to split the drain-source voltage across a shield transistor and a current source transistor. In order to do this, shield transistor 340 is connected in series with current source transistor 332, and shield transistor 342 is connected in series with current source transistor 334. Consequently, the drain-source voltage previously appearing across transistors 332 and 334 now appears across transistor pairs 332, 340 and 334, 342. As will hereinafter be described, appropriate voltages are applied to the gate electrodes of shield transistors 340 and 342 to insure that the drain-source voltage across each of the four devices remains below the threshold where impact ionization becomes a problem. In addition, the shield device gate voltages are controlled so that, illustratively, the shield devices remain in the saturation mode throughout the entire circuit operating range thereby avoiding abrupt gain changes.

In particular, the output voltages $V_{OUTP}$ and $V_{OUTN}$ at the drain electrodes of transistors 340 and 342 on leads 344 and 346, respectively, are applied, via leads 348 and 350, to the gate electrodes of sensing devices 352 and 354.

More particularly, device 352 is a PMOS device, which together with current source 356, resistors 390 and 392 and diode 398 is connected as a voltage-follower circuit. The output of the voltage-follower device 352 (which is equivalent to the output voltage $V_{OUTP}$) is applied across the resistive divider consisting of resistors 390 and 392. The divided voltage on lead 395 is, in turn, applied to the gate electrode of shield transistor 342. Consequently, as the output voltage $V_{OUTP}$ is increased, the gate electrode of shield transistor 342 also increases by a amount determined by the ratio of resistors 390 and 392. If the resistors 390 and 392 are equal, then the shield voltage increases approximately half as much as the output voltage, and the gate voltage of shield transistor 342 follows the drain voltage of transistor 342 with a gain of 0.5. The connection insures that the output voltage is split approximately equally between the shield transistor 342 and current source transistor 334 and that shield transistor 342 remains in the saturation mode over the entire output voltage swing.

In the particular implementation illustrated, the current running through resistors 390 and 392 and through the PMOS voltage follower device 352 is recombined and applied to a diode-connected MOS device 398 so that a signal-independent current is returned, through the diode 398, to the $V_{SS}$ voltage rail 302.

In a similar manner, the output voltage $V_{OUTN}$ on lead 346 is applied, via lead 350, to the gate electrode of a PMOS device 354, which in connection with current source 358 and resistors 394 and 396 performs as a voltage follower. In a manner similar to that described for resistors 390 and 392, resistors 394 and 396 form a voltage divider and the divided output voltage is applied, via lead 397, to the gate electrode of shield transistor 340, so that the output voltage $V_{OUTN}$ is divided evenly across the shield transistor 340 and the current source transistor 332 and shield transistor 340 remains in the saturation mode.

Also in a similar manner to that previously described, the current running through resistors 394 and 396 is combined with the current running through the voltage-follower device 354 and applied to diode 400, so that a signal-independent current is returned, through the diode 400, to the $V_{SS}$ rail 302.

The outputs of the follower devices 352 and 354 are combined via resistors 368 and 364 and capacitors 360 and 362, and applied to the gate electrode of transistor 370. Transistors 370 and 372 perform a differential output circuit in connection with current source 363. The gate electrode of transistor 372 is biased by means of the bias circuitry consisting of devices 388 and 386, and resistors 380, 382 and 384. The function of elements 370-388 is to provide common mode feedback to maintain the common mode voltage at the two outputs at voltage ground (GRND 402).

Since the output drain-source voltage is divided between the shield and current source transistors, the aforementioned impact ionization problems are greatly reduced. Further since the gate of each shielding device follows its drain voltage, the aforementioned transition between shield device operating regions is also avoided.

A simulation of a device construction such as that shown in FIG. 3 has been made indicating that the impact ionization effects are reduced drastically with the inventive construction. In particular, without the inventive construction and shield transistors, the simulated circuitry had approximately a worst case 1 mV peak input-referenced voltage non-linearity due to the non-linear gain. When the shield transistors and inventive bias circuitry were added to the construction, a 10 microvolt peak non-linearity, worst case, resulted. The worst case distortion of the operational amplifier without the shield transistors and associated bias circuitry was −78 dB. The worst case distortion of the operation amplifier with the shield transistors and bias circuitry installed, was −99 dB.

Figure 4:
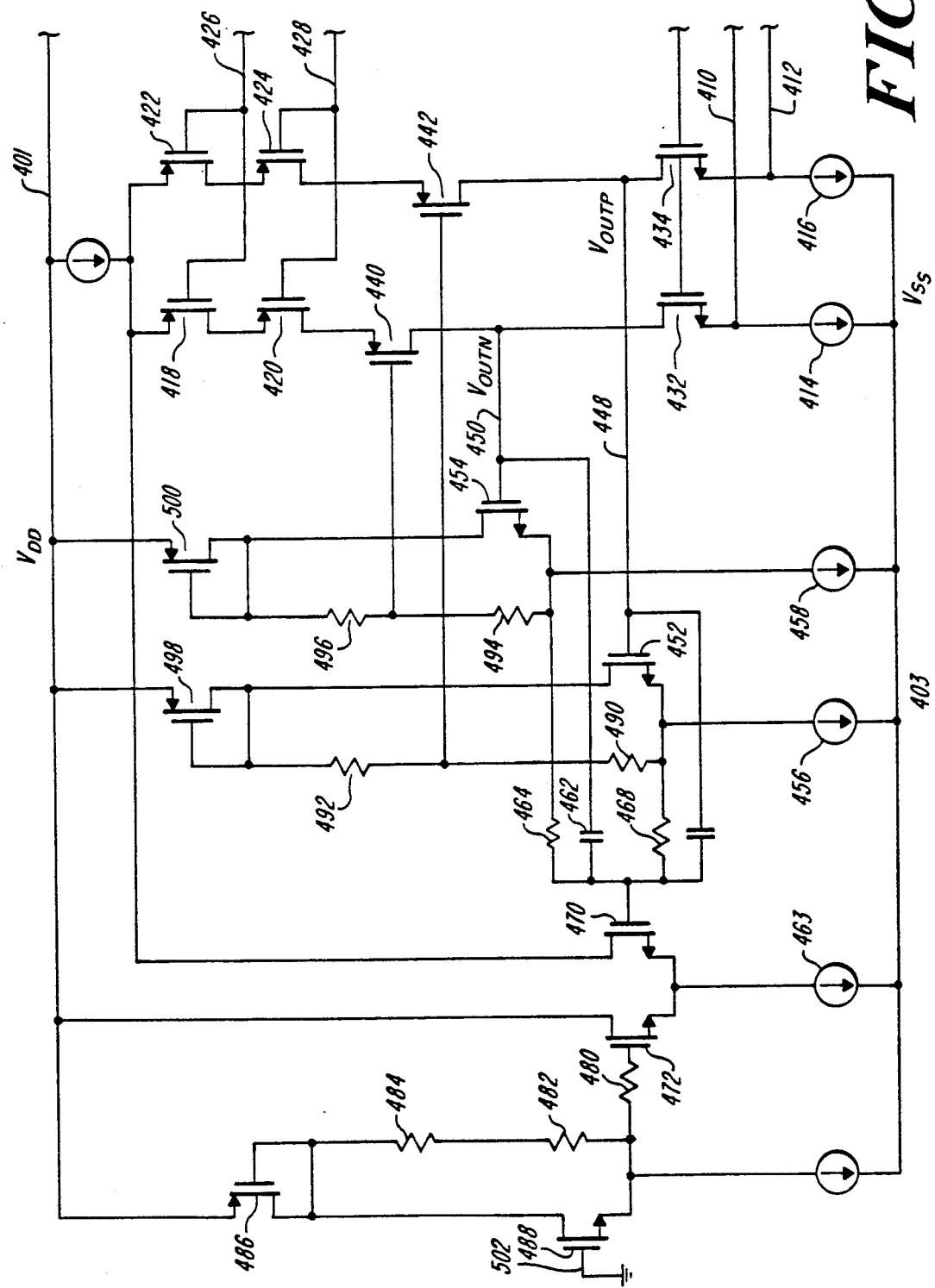
FIG. 4 is an alternative embodiment of the driver section of the amplifier shown in FIG. 3 in which the shield transistors are P-channel devices rather than the N-channel devices used in FIG. 3.

The inventive shield transistor arrangement can also be used in circuits, such as amplifiers, in which the driver section is comprised of P-channel and N-channel transistors connected in a manner complementary to that shown in FIG. 3. It is also possible to use P-channel devices for the shield transistors as well as N-channel devices. FIG. 4 illustrates an amplifier constructed in the same manner as the amplifier shown in FIG. 3 with P-channel shield transistors. When P-channel transistors are substituted for the N-channel shield devices, straightforward changes are needed to complement the circuitry which senses the output voltages in order to drive the shield transistor bases. In FIG. 4, the bias generator circuitry and the input circuitry is essentially the same as shown in FIG. 3 and is not repeated for clarity. In FIG. 4, drain voltage source 401 corresponds to drain voltage source 300 in FIG. 3 and the source voltage source 403 corresponds to source voltage source 302. Transistor 500 in FIG. 4 corresponds to transistor 400 in FIG. 3 and lead 502 corresponds to lead 402. The remaining components in FIG. 4 correspond directly to components in FIG. 3 with analogous numbers. For example transistor 434 in FIG. 4 corresponds to transistor 334 in FIG. 3 and transistors 332 and 432 correspond. The operation of the circuit shown in FIG. 4 is analogous to that shown in FIG. 3.

Although only one embodiment of the present invention has been described in detail, other changes and modifications will be immediately apparent to those skilled in the art. For example, the illustrated shielding technique could also be applied to PMOS devices if higher supply voltages make the impact ionization effect a problem. In addition, although in the illustrated embodiment, the total drain source voltage is split approximately equally between the shield and current source transistors, the circuit parameters could easily be changed to make the drain-source voltage division unequal as long as the drain-source voltage each any one device is not sufficiently great to cause an impact ionization problem. Further, as illustrated, each shield transistor remains in its saturation mode due to the inventive gate drive, but adjustments to the circuit could be made to operate the circuit with one or more shield transistors operating in their linear modes as long as a mode transition between the saturation and linear modes in a shield transistor is avoided. The illustrated technique can also be used to prevent MOS devices from entering high VDS breakdown regions, thereby preventing device damage. These changes and modifications are intended to be covered following claims.

What is claimed is:

1. A gain correction circuit for an MOS analog circuit having a gain stage comprising an MOS driver means, an MOS current source transistor connected in a series connection with said driver means and means for applying a supply voltage across said series connection, said gain correction circuit comprising:

an MOS shield transistor connected in series between said driver means and said current source transistor so that an output voltage appears across said shield transistor and said current source transistor, said shield transistor having a gate and a drain, and wherein said shield transistor can operate in a saturation operating mode and a linear operating mode; and means responsive to said output voltage for applying a bias voltage to said shield transistor gate which bias voltage varies with said output voltage in accordance with a predetermined linear relationship;

wherein said applying means comprises means for sensing said output voltage and means responsive to said sensed output voltage;

wherein said sensing means comprises a voltage divider network and means for applying said output voltage to said voltage divider network.

2. A gain correction circuit according to claim 1 wherein said output voltage applying means comprises a voltage follower.

3. A gain correction circuit according to claim 1 wherein said driver means comprises two MOS active transistors connected in series.

4. A gain correction circuit according to claim 3 wherein both of said active transistors are p-channel devices.

5. A gain correction circuit according to claim 1 wherein said shield transistor is an n-channel device.

6. A gain correction circuit according to claim 1 wherein said output voltage is divided equally across said shield transistor and said current source transistor.

* * * * *